US006998713B2

(12) United States Patent
Narizuka et al.

(10) Patent No.: US 6,998,713 B2
(45) Date of Patent: Feb. 14, 2006

(54) WIRING BOARD AND METHOD FOR PRODUCING SAME

(75) Inventors: Yasumori Narizuka, Tokyo (JP); Mitsuko Itou, Tokyo (JP); Yoshihide Yamaguchi, Tokyo (JP); Hiroyuki Tenmei, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/833,790

(22) Filed: Apr. 27, 2004

(65) Prior Publication Data

US 2004/0201105 A1 Oct. 14, 2004

Related U.S. Application Data

(63) Continuation of application No. 10/302,034, filed on Nov. 21, 2002, now Pat. No. 6,756,688, which is a continuation of application No. 09/913,975, filed on Aug. 20, 2001, now Pat. No. 6,515,372.

(30) Foreign Application Priority Data

Feb. 26, 1999 (JP) ................................ 11-049450

(51) Int. Cl.
*H01L 23/48* (2006.01)

(52) U.S. Cl. ...................... 257/762; 257/736; 257/772; 257/774; 257/776; 257/779; 257/781; 257/786; 257/792; 430/314

(58) Field of Classification Search ................ 257/736, 257/772, 774, 776, 779, 781, 786, 792; 430/314
See application file for complete search history.

(56) References Cited

U.S. PATENT DOCUMENTS

| | | | |
|---|---|---|---|
| 4,835,593 A | 5/1989 | Arnold et al. | |
| 5,285,016 A | 2/1994 | Narizuka et al. | |
| 5,527,628 A | 6/1996 | Anderson et al. | |
| 5,712,192 A | 1/1998 | Lewis et al. | |
| 5,793,117 A | 8/1998 | Shimada et al. | |
| 5,949,654 A | 9/1999 | Fukuoka | |
| 6,268,114 B1 * | 7/2001 | Wen et al. | 430/314 |
| 6,515,372 B1 * | 2/2003 | Narizuka et al. | 257/779 |
| 6,756,688 B1 * | 6/2004 | Narizuka et al. | 257/779 |

FOREIGN PATENT DOCUMENTS

| | | |
|---|---|---|
| EP | 042943 | 1/1982 |
| JP | 06-53648 | 2/1994 |
| JP | 07-297321 | 11/1995 |
| JP | 08-45990 | 2/1996 |
| JP | 3027269 U | 5/1996 |
| JP | 09-219421 | 8/1997 |

(Continued)

*Primary Examiner*—Mai-Huong Tran
(74) *Attorney, Agent, or Firm*—Townsend and Townsend and Crew LLP

(57) ABSTRACT

The invention relates to a wiring board comprising a board having an electrode and being coated with an insulation layer with a hole for exposing the electrode; a wiring comprising a Cr or Ti layer, which is connected to the electrode and closely contacts with the insulation layer, and of a Cu layer which is closely contacts with the Cr or Ti layer; a protective film which covers the wiring and is provided with another hole for soldering; and a solder for the outer connection which is mounted in the both holes and brought to diffuse into the Cu layer to produce an alloy, and brought to reach the Cr or Ti layer thereby connecting the solder to the Cr or Ti layer.

10 Claims, 7 Drawing Sheets

FOREIGN PATENT DOCUMENTS

| | | |
|---|---|---|
| JP | 09-321084 | 12/1997 |
| JP | 10-092865 | 4/1998 |
| JP | 10-65057 | 6/1998 |
| JP | 10-284846 | 10/1998 |
| JP | 11-054649 | 2/1999 |
| JP | 11-191571 | 7/1999 |
| JP | 11-354560 | 12/1999 |
| WO | WO96/09645 | 6/1996 |
| WO | WO 98/25298 | 6/1998 |
| WO | WO99/23696 | 5/1999 |

* cited by examiner

RELIABILITY OF CONNECTION STRENGTH OF JOINTS (KEPT AT HIGH TEMPERATURE)

WIRING BOARD AND METHOD FOR PRODUCING SAME

CROSS-REFERENCES TO RELATED APPLICATIONS

The present application is a continuation of U.S. application Ser. No. 10/302,034, filed Nov. 21, 2002 now U.S. Pat. No. 6,756,688, which is a continuation of U.S. application Ser. No. 09/913,975, filed Aug. 20, 2001 (now U.S. Pat. No. 6,515,372), which in turn is related to and claims priority from Japanese Application No. HEI 11-049450, filed Feb. 26, 1999, all of which are incorporated herein for all purposes.

BACKGROUND OF THE INVENTION

The present invention relates to a structure of a wiring board (or a circuit board), a producing method thereof, a semiconductor device, a producing method thereof, which are used in common electronic apparatuses each comprising a board(s) carrying an LSI(s), and an electronic apparatus, especially the same as above and a semiconductor device package structure which are suitable for such electronic apparatuses which are required to meet the compatibility between high reliability and a lower manufacturing cost.

Such a conventional wiring board can be seen in JP-A-62-263661.

According to the prior art, the multi-layered metal structure of which layers are interconnected with one another on a board and which comprises a bond layer comprising an element selected from the group of Ti, Ba, Cr and Ta, which is deposited on the board, a stress relaxation layer comprising an element selected from the group of Cu, Fe, Al, Ag, Ni and Au, which is deposited on the bond layer, a barrier layer comprising Ti or Zr and a wetable surface layer.

In the case where a solder is brought into direct contact with a wiring layer in order to connect a wiring board with an outer circuit, there will occur a phenomenon that composition elements of the solder and the wiring layer migrate each other between them during soldering or by a change with the passage of time after soldering resulting in loss of component elements of a wiring material (so called "solder damage"). Since an alloy layer is produced from the elements derived from the solder and the wiring layer under the phenomenon, there will arise a problem of harmful effects that the bonding part becomes brittle and of high electric resistance. If the "solder damage" further develops, the solder reaches the bottom face of the wiring material to deteriorate adhesion between the wiring material and an under layer so that the bonding part is delaminated from the under layer resulting in a defective product.

Therefore, in order to prevent occurrence of the above defect at the bending portion by soldering, the following two countermeasures have been usually adopted.

One method thereof is to prevent the solder from reaching the bottom face of the wiring material during the producing method and operation of the apparatus by making the wiring material thick.

Another method is to protect the wiring from the solder by providing a protective coating onto the wiring, which has high resistance against the solder damage, and by stopping the migration due to the solder within the protective coating.

The former method of making the wiring material thick does not solve the problem of strength reduction due to the formation of the alloy layer produced at the bonding part and causes some technical difficulties in other processes including a process of forming an insulation layer and another forming process because of an increase of the thickness of the wiring material.

In case of forming the protective coating layer with high resistance against the solder, namely the solder diffusion barrier layer called the UBM (Under Bump Material) or BLM (Ball Limiting Metallurgy) according to the latter method, a metal layer which is not usually used for wiring materials, for example, Ni, Ni—Cr, Ni—Cu, Pt, etc. must be additionally formed and processed so that the process steps increase and a higher level technology will be required.

On the other hand, because of demands for higher performance and more multi-function of electronic apparatuses, the total length of the wiring to be accommodated in the wiring board used for them is rapidly increasing so that the wiring becomes further finer and a further advanced multilayer is required. Furthermore, in view of transfer quality of signals in a wiring board, requirements for the form of wiring and the positional accuracy of wiring, etc. become more strict and severer so that, for keeping the function at connecting portions with outside as stated in the above, it becomes difficult to change specifications for wiring. Therefore, in case of advanced electronic apparatuses, specifications for wiring are determined on the basis of electrical characteristics so that a structure, in which connecting electrodes with a material having higher resistance against the solder damage are provided to another layer, is becoming the main current.

But, such a structure has a problem that process steps increase and a higher level technology is required leading to a remarkably higher production cost.

Further, with regard to the fine wiring on wiring boards hereafter, it will be necessary to apply soldering to a wiring board with solder-connecting electrodes each having a small surface area, which is called "micro-soldering". Especially, for a metal composition and a thickness of the UBM and forming thereof, a much higher level technology will be required in the future.

BRIEF SUMMARY OF THE INVENTION

An object of the invention is to provide a wiring board and a semiconductor device having a high density and high reliability in solder-connecting.

Another object of the invention is to provide methods of producing a wiring board and a semiconductor device in which the wiring board and the semiconductor device each having a high density and high reliability in solder-connecting can be produced at a low cost.

A still further object of the invention is to provide an electronic apparatus and a semiconductor device package structure which have a wiring board and a semiconductor device each having a high density and high reliability in solder-connecting and being capable of a low cost production.

Under the objects, according to the present invention, there is provided a wiring board which comprises:

an insulation layer formed on the wiring board; and a wiring comprising a Cu layer and a Cr or Ti layer which is arranged between the Cu layer and the insulation layer under the Cu layer in order to closely connect the Cu layer with the insulation layer, wherein a solder for the outer connection is provided on the Cu layer and brought to diffuse into the Cu layer to produce an alloy, and brought to reach the Cr or Ti layer thereby connecting the solder to the Cr or Ti layer.

According to the present invention, there is provided also a wiring board which comprises:

- a board having an electrode and being coated with an insulation layer with a hole for exposing the electrode;
- a wiring comprising a Cr or Ti layer, which is connected to the electrode and closely contacts with the insulation layer, and a Cu layer which is closely contacts with the Cr or Ti layer;
- a protective film which covers the wiring and is provided with another hole for soldering; and
- a solder for the outer connection which is mounted in the both holes and brought to diffuse into the Cu layer to produce an alloy, and which reaches the Cr or Ti layer thereby connecting the solder to the Cr or Ti layer.

The followings are preferable embodiments of the invention:

- The solder for the outer connection used in the wiring board may comprise Sn.
- The Cu layer in the wiring board may have a thickness of from about 0.1 μm to about 10 μm.
- In the wiring board, the Cr layer may be provided between the Cu layer and the insulation layer.
- The insulation layer in the wiring board may comprise an organic resin layer.
- The solder for the outer connection used in the wiring board may be directly connected to the wiring layer which is connected to the electrode on the wiring board.
- An Au layer, an Ni—Au layer or a rust prevention layer such as preflux may be provided between the solder for the outer connection and the Cu layer in the wiring board in order to improve wettability of the solder.

According to the invention, there is provided also an electronic apparatus in which a solder for the outer connection in a wiring board is connected to electronic components.

According to the invention, there is provided also a method of producing a wiring board, which comprises the following steps:

- a step of forming an insulation layer on a wiring board;
- a step of forming a wiring, in which a Cr or Ti layer and a Cu layer are laminated on the insulation layer formed in the prior step; and
- a reflow bonding step, in which a solder for the outer connection is provided on the Cu layer and brought to diffuse into the Cu layer to produce an alloy, which reaches the Cr or Ti layer thereby connecting the solder to the Cr or Ti layer.

According to the invention, there is provided also a method of producing a wiring board, which comprises the following steps:

- a step of forming an insulation film, which comprises coating a wiring board having an electrode by the insulation film and forming a hole in the insulation film in order to expose the electrode;
- a step of forming a wiring, in which a Cr or Ti layer is connected to the electrode and brought into close contact with the insulation film, and a Cu layer is closely laminated on the Cr or Ti layer;
- a step of forming a protective film, which comprises coating the wiring, being formed in the prior step, with the protective film and forming another hole in the protective film for soldering; and
- a reflow bonding step, in which a solder for the outer connection is provided within the hole of the protective film and brought to diffuse into the Cu layer in the wiring to produce an alloy, which reaches the Cr or Ti layer thereby connecting the solder to the Cr or Ti layer.

According to the invention, there is provided also a semiconductor device which comprises:

- a semiconductor board having an electrode and being coated with an insulation layer being formed with a hole in order to expose the electrode;
- a wiring comprising a Cr or Ti layer which is close contact with the insulation layer and of a Cu layer which is closely laminated on the Cr or Ti layer;
- a protective film covering the wiring and being formed with a hole for soldering; and
- a solder for the outer connection which is provided within the hole of the protective film and brought to diffuse into the Cu layer in the wiring to produce an alloy which reaches the Cr or Ti layer thereby connecting the solder to the Cr or Ti layer.

In the wiring of the semiconductor device, preferably the Cr layer may be provided between the Cu layer and the protective film.

In the semiconductor device, the insulation layer may comprise an organic resin layer.

According to the invention, there is provided a semiconductor device package structure in which a solder for the outer connection is connected to an electronic component such as a package board.

As is described in the above, according to the present invention, since the UBM is not needed to form, manufacturers can be released from an additional process of forming the UBM and technical difficulty. Further, since the wiring can be determined only by an electrically required thickness thereof regardless connecting portions, it is possible to improve electrical characteristics of the wiring. A further advantage is a realized cost reduction because of less steps of the whole producing method.

BEST MODE FOR CARRYING OUT THE INVENTION

Figure 1:
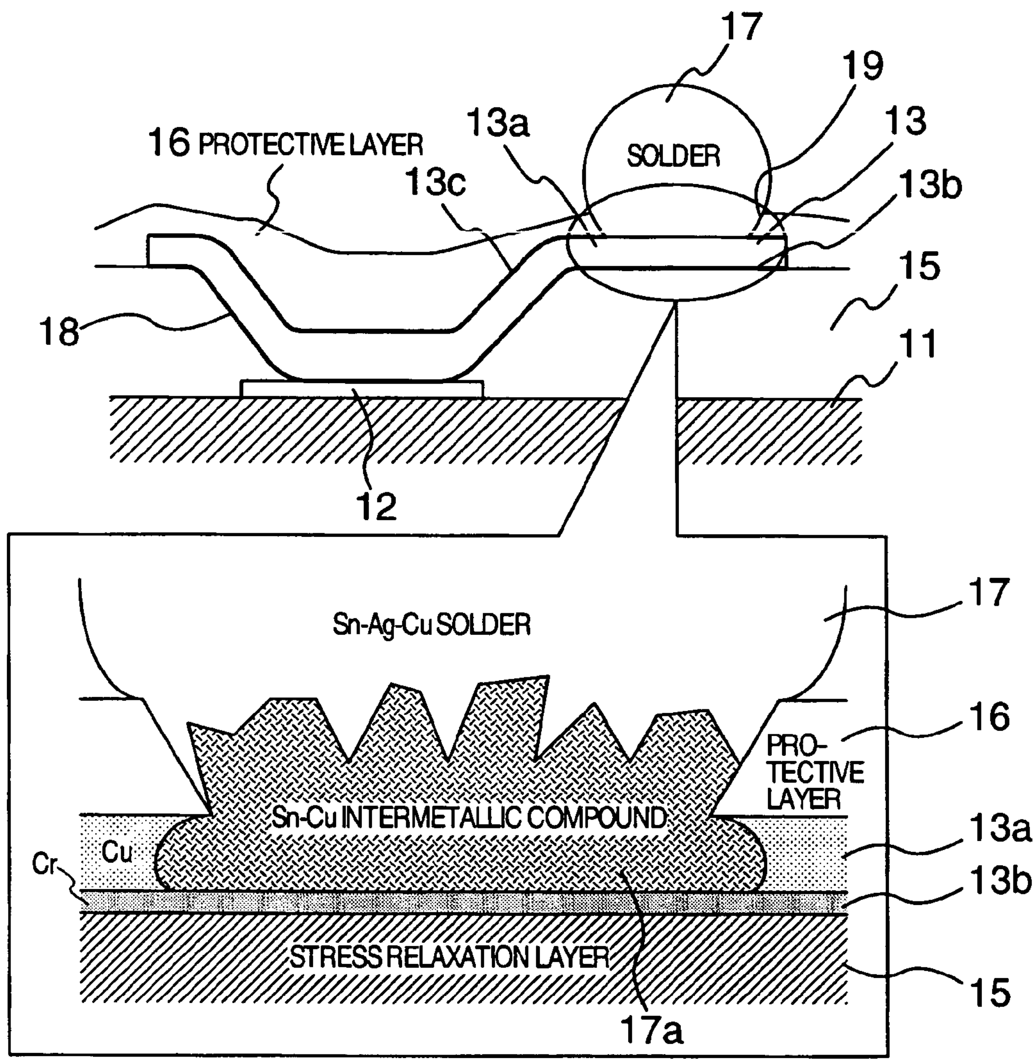
FIG. 1 is a sectional view of a wiring board and a semiconductor device according to one embodiment of the invention.

Herein below, with reference to the attached drawings, there is provided a description on embodiments of wiring boards, semiconductor devices, semiconductor device package structure and electronic apparatuses according to the invention.

While there have been used a bonding metal layer between an under layer and a wiring, which is provided in the lower region of a wiring layer in order to ensure a close contact bonding between the under layer and the wiring, the present inventors have found that it is possible to provide the bonding metal layer with a resistive function against solder migration as well as the bonding property by a specific combination of the bonding metal and a solder material.

On the other hand, recently a lead free Sn—Ag system solder is becoming a mainstream from the view point of environment protection. It is also noted that, in the case of a tin-containing solder including a Sn—Pb system solder, since the connection can be attained basically by the alloying reaction between Sn and an electrode metal, the resistance against "the solder attack" depends on the alloying reaction.

Since the inventors found that Cr and Ti have high resistance against the alloying reaction between Sn and the metals, they considered to make an electrode by Cr or Ti. But, they have confirmed that, since the both metals are chemically very active, an oxide film is instantaneously formed on the metal of Cr or Ti in the air so that soldering to the metals are impossible because the metals are not wetable by molten solder, and that the oxide film can not be removed completely by usual ways.

Thus, the inventors tried to coat the surface of the metal of Cr or Ti by a metal which is wetable by solder, and have found that Cu is most appropriate for the coating material from the view point of preventing oxidation, manufacturing cost, etc.

The inventors have found also that reliability on the soldering connection is unstable unless solder reaches Cr or Ti layer through the coating layer of Cu during soldering. This will be because, from supposition, even if solder diffuses into the coating layer and reaches a region around the Cr or Ti layer for a long term use, a very thin oxide film may be formed at the interface between the coating layer and the Cr or Ti layer due to oxygen penetration through the coating layer for a long term so that solder can not reach the Cr or Ti layer. Thus, the Cu layer is required to have a thickness of not less than 0.1 $\mu$m in order to intercept oxygen from penetration during the producing method and of 10 $\mu$m at most because solder must diffuse through the Cu layer to the Cr or Ti layer during soldering.

The present invention has been made taking the above examination results into consideration, according to which a Cu or Ti layer is used as a bonding layer and a barrier layer for preventing diffusion of solder, and a coating layer of Cu is used for preventing oxidation since Cu is practically the lowest resistance material. In the invention, a wiring material consists of a multiple layer of Cr/Cu/Cr or Ti/Cu/Cr, a part of which is removed to partially expose the Cu layer in order to use the exposed position as an electrode for soldering. In this regard, noted is that it is required for the Sn-containing solder to diffuse through the Cu layer and surely reach the Cr or Ti under-layer as the bonding layer during soldering.

As is shown in FIG. 1, a wiring board and a semiconductor device according to the invention consist of a board 11 for LSIs (semiconductor chips), a MCM, etc., an electrode (bump) 12 made of Al, Au, Ag, etc. formed on the board 11, a wiring 13 connected to the electrode 12, an insulation film 15 (which apparatus also as a stress relaxation layer) of polyimide, $SiO_2$, SiN, etc. provided between the wiring 13 and the board 11, a protective film 16 with a hole for connecting (jointing) a solder 17 to protect the surface of the wiring 13 and the solder 17 for the package connection to an electrode in an outside circuit of a package board, etc. which is provided for the hole made in the protective film 16.

The insulation layer 15 relaxes the stress produced in the solder 17 due to a difference of thermal expansion, etc. between the board 11 and a package board which is an outside circuit.

The wiring 13 according to the invention is formed by laminating a Cu layer 13*a* of about 0.1 to 10 $\mu$m thickness which is practically the lowest resistance material at the connecting portion to the outside circuit, a Cr or Ti thin film layer 13*b* of about 0.05 to 1.0 $\mu$m thickness at the side of the under layer 15 and a Cr thin film layer 13*c* of about 0.01 to 0.3 $\mu$m thickness at the side of the protective film 16. The thin film layers 13*b* and 13*c* are bonding metals which have excellent property of bonding to the insulation layer 15, the protective film 16 and the Cu layer 13. Further, in the case where Ti is used for the thin film layer 13*c* at the side of protective film 16, a partial removal thereof is difficult.

Especially, the thin film layer 13*b* according to the invention is made of Cr or Ti which has excellent property of bonding to the under layer (insulation film) 15 and very high resistance against the formation of alloy with the Sn-containing solder. However, since Cr and Ti are chemically very active, an oxide film is instantaneously formed in the air which is not wetable by molten solder and makes it impossible to connect and it has been confirmed that the oxide film can not be easily removed by usual ways. Thus, trying to coat the surface of Cr or Ti by a metal which is well wetable to with solder, it has been found that Cu is most appropriate as coating layer 13*a* from the view point of preventing oxidation, cost, etc.

The producing method for the wiring board and the semiconductor device up to the stage of providing the solder 17 will be described below referring to FIG. 2.

Figure 2:
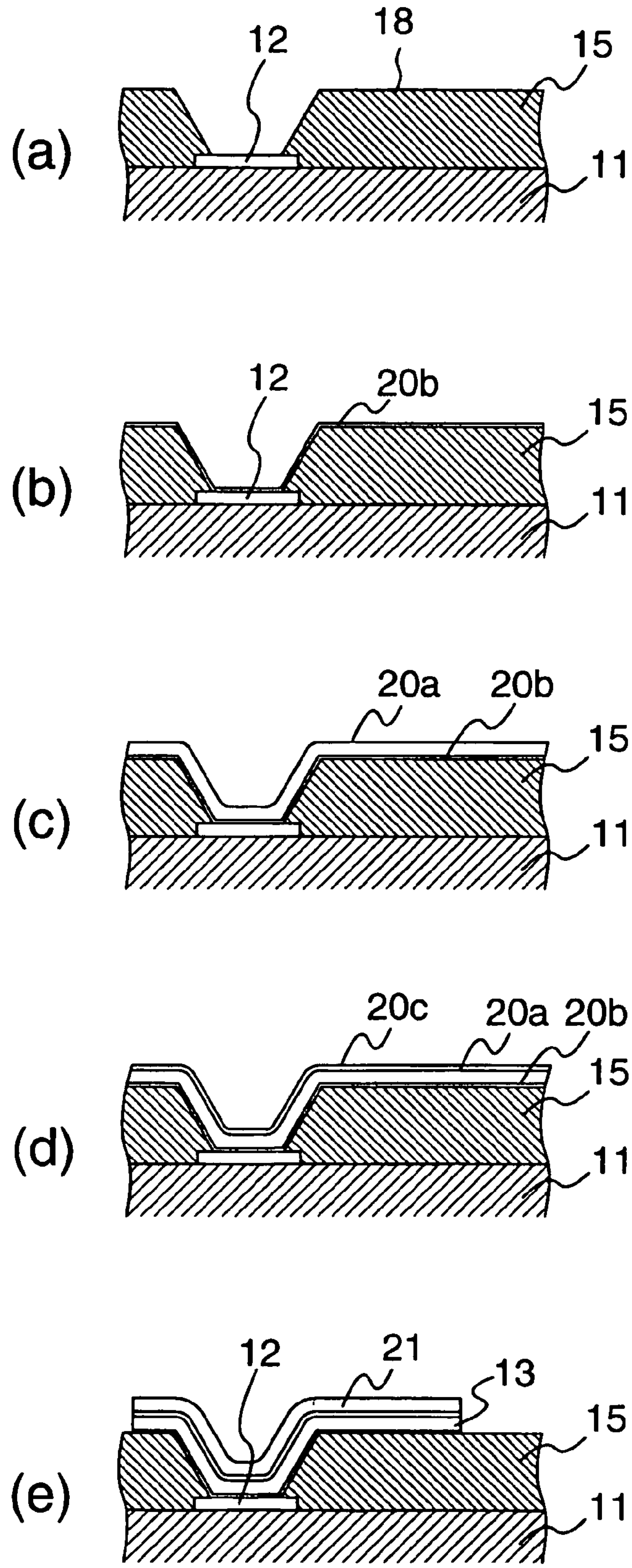
FIG. 2 illustrates a first half of the production process for a wiring board and a semiconductor device according to one embodiment of the invention.

First, in the case where the board 11 is an LSI, as shown in FIG. 2(*a*), an opening 18 is formed in an inorganic passivation film 15 by dry etching to partially expose electrode (or pad) 12 at least to connect to the outside on the electrode 12 made of Al, etc.

Further, in the case where the board 11 is a wiring board for a MCM (multi-chip module), as shown in FIG. 2(*a*), by the producing method suitable to the material type of insulation layer 15, the opening 18 is formed to at least partially expose the electrode (pad) 12. In the case where the insulation layer 15 is made of an organic material such as polyimide, etc., the opening 18 is formed the photo-etching method. It is also possible to form the opening 18 by forming the insulation layer by means of the printing method. In the case of the inorganic insulation layer, the photo-etching method can also be applied. The etching method may be wet etching or dry etching. In the case of isotropic etching, the opening 18 can have an outwardly divergent form. Anisotropic etching may be also applied thereto.

Next, when forming the thin Cr or Ti film 13*b* on the surface of the electrode 12 of Al, etc., just prior to forming the film, the spattering etching treatment is applied and after exposing the metal of Al, etc. by removing the oxide film from the surface of the electrode of Al, etc., the film is immediately formed without exposing it to the air. If the oxide film is not completely removed, the residual oxide portion will have a high electric resistance of from several to several hundreds ohms (Ω).

Without exposing the board 11 to the air after removing oxide from its surface, the wiring pattern 13 is formed immediately as shown in FIG. 2(*b*) to FIG. 2(*e*). There may be two methods for forming the wiring pattern 13. A first method is to form continuously three layers of a Cr or Ti thin film layer 20*b*, a Cu layer 20*a* and a Cr thin film layer 20*c* by spattering from the beginning as shown in FIG. 2(*b*) to FIG. 2(*d*) and thereafter, to progressively remove unnecessary portions one by one starting from the upper layer by the photo-etching using a resist mask 21 as shown in FIG. 2(*e*). A second method comprises forming continuously Cr or Ti thin film layer and a Cu thin film layer (with a small thickness of about 0.1 to 0.5 μm), next forming a pattern Cu plating 13*a* by a semi-additive method, and subsequently removing unnecessary portions of the thin films. In the latter method, there may be a case that a thin Ni coating is finally plated on the wiring for protecting from oxidation, etc. and for improving bonding strength with the protective film.

Figure 3:
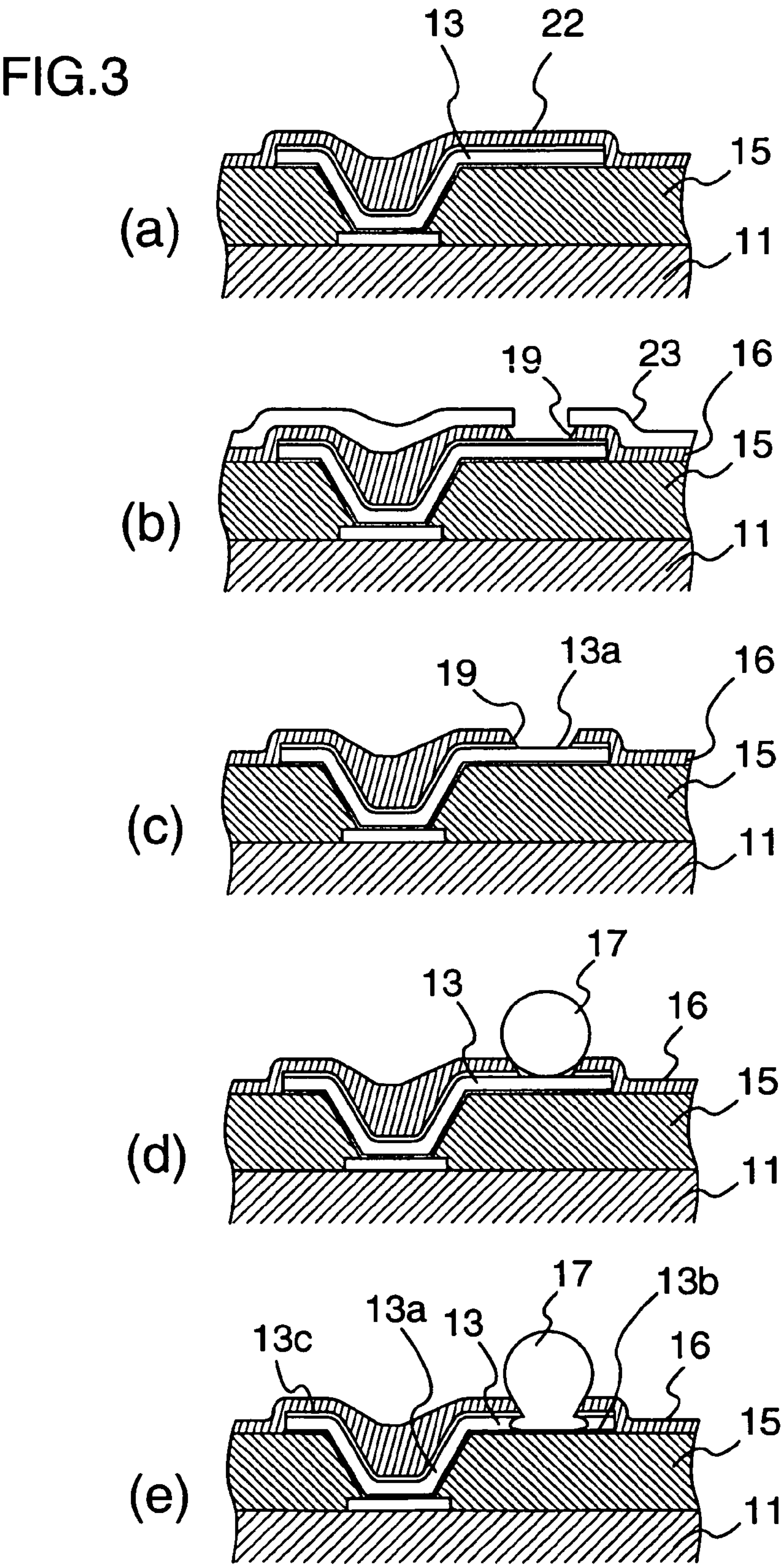
FIG. 3 illustrates a second half of the production process for the wiring board and the semiconductor device according to the embodiment of the invention.

After the wiring pattern 13 is completed, it is covered by an organic insulation film such as polyimide, etc. or an inorganic insulation film 22 such as SiO2, etc. as shown in FIG. 3(*a*) for protecting the wiring pattern and electric insulation, and subsequently an opening 19 (or a hole for soldering connection) is formed at the position of soldering connection by the photo-etching process using a resist mask 23 as shown in FIG. 3(*b*) to expose the surface of the wiring 13. Subsequently the wiring board is dipped into a Cr-etching solution, the protective film (insulation film) 16 works as mask and the upper layer of Cr film 13*c* is removed only at the opening portion 19 in the protective film 16 to expose the Cu layer 13*a* as shown in FIG. 3(*c*).

The following is a description of connection between the solder 17 and the wiring of Cu layer, which is the key feature of the invention. The soldering materials containing Sn are also general and those of Sn—Pb system are most widely used. However, from the point of environmental protection, the lead-free Sn—Ag system solder is used herein.

In the case of the Sn-containing solder, since the connection is basically achieved by alloying, the resistance against the solder damage depends on the alloying reaction between Cu and Sn. Since the present inventors have found that Cr and Ti have high resistance against alloying with Sn, an electrode made of Cr or Ti was once nominated. However, it has been confirmed that, since these metals are chemically very active, an oxide film, which is not wetable by molten solder, is instantaneously formed in the air, soldering connection is impossible, and that the oxide film can not be completely removed by usual methods.

Thus, trying to coat the metal of Cr or Ti with another metal which is wetable by solder, it has been found that Cu is the most appropriate material as a coating layer from the point of preventing oxidization, cost, etc.

Accordingly, as shown in FIG. 3(*d*), by providing the lead-free Sn—Ag system solder to the opening 19 (a hole for soldering connection) formed in the protective film 16, soldering is carried out under the reflow conditions of solder as shown in FIG. 3(*e*).

The lead-free Sn—Ag system solder has a melting point of about 230° C. so that, taking a temperature variance on the board 11 into consideration, the reflow soldering is carried out at a temperature of about 250° C.

The processing time of reflow is set to about 30 seconds for about 3 μm thickness of the Cu layer 13*a,* about 1 minute for about 5 μm thickness of the Cu layer 13*a* and 1.5 to 2 minutes for about 10 μm thickness of the Cu layer 13*a*. Thereby, in the case of the Sn-containing solder, the soldering connection can be achieved basically by alloying 17*a* (Sn—Cu inter-metallic compound) between Sn and Cu so that the solder can reach and connect with the under layer 13*b* of Cr or Ti. Thus, it is possible to ensure bonding reliability of the soldering connection.

Actually, the main component of Sn of the solder reacts with Cu to form an alloy so that it diffuses through the Cu layer and connects with Cr or Ti layer 13*b* to attain the soldering connection as shown in the enlarged view of FIG. 1. Such alloying reaction does no more advance thereafter.

Figure 4:
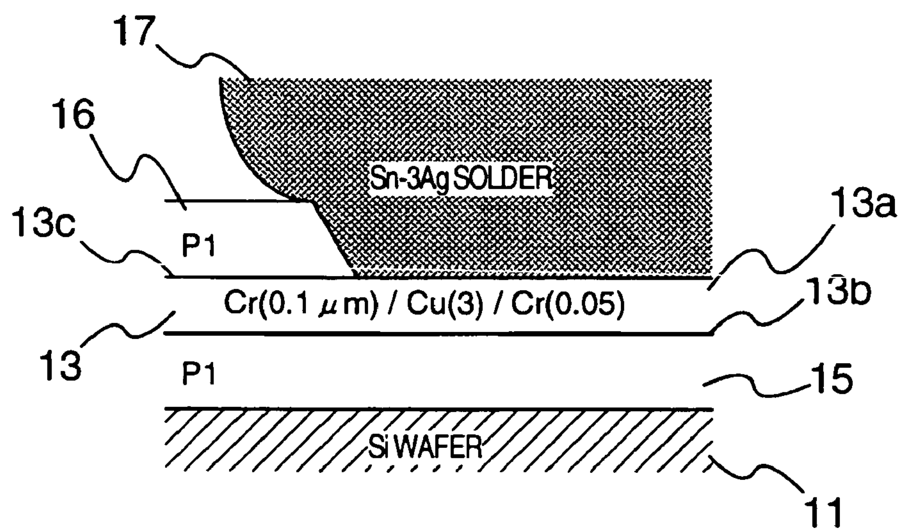
FIG. 4 is a sectional view of another wiring board and another semiconductor device according to another embodiment of the invention.

Referring to FIG. 4, a joint structure between a wiring and solder, which is one embodiment of a semiconductor device according to the invention, will be described below. The joint structure consists of a Si wafer board 11, a polyimide insulation layer 15, a wiring 13 of three layers which are a Cr thin film layer 13*b* (about 0.1 μm of thickness), a Cu layer 13*a* and a Cr thin film layer 13*c* (about 0.05 μm of thickness, a polyimide protective film 16 and a lead-free Sn-3Ag system solder. A solder ball has a diameter of about 270 μm. A UBM (Under Bump Metal) has a diameter of about 250 μm.

Figure 5:
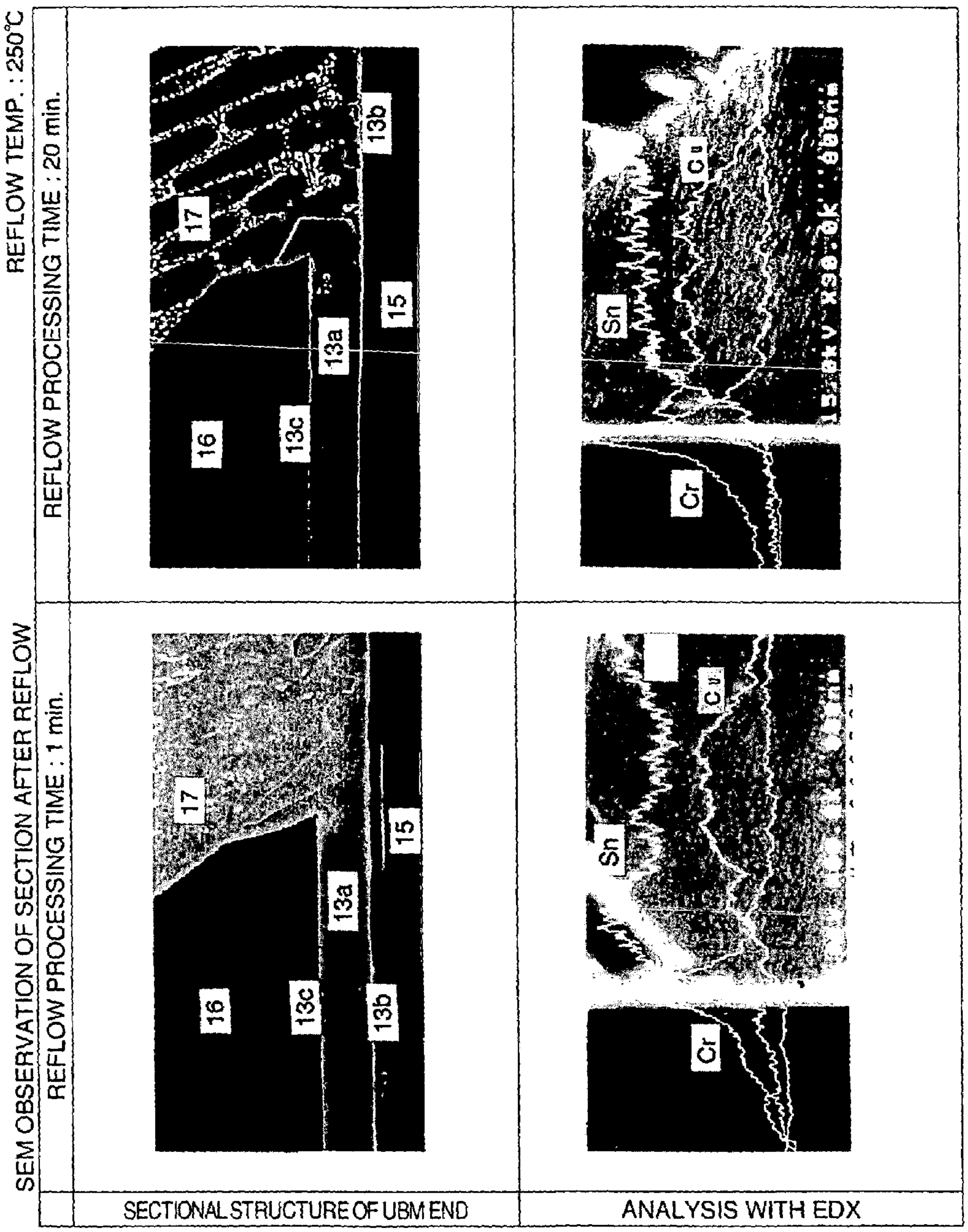
FIG. 5 shows sectional views after reflow bonding according to an SEM observation of the embodiment shown in FIG. 4.

FIG. 5 shows sectional views after reflow bonding according to an SEM observation of the device. In the case where the reflow temperature is about 250° C. and the reflow processing time is one minute, the solder diffuses through the Cu layer and reaches the Cr (or Ti) layer 13*b* as shown in the sectional structure of UBM (Under Bump Metal) end. But, since the Cu layer still partially remains, a lot of Sn which is the main component of the solder can been seen around the position to show the peak of Cr and contrasting it can be seen that only a few Cu of the Cu layer 13*a* remains according to the analysis with EDX (Energy Dispersive X-ray spectroscopy). In the case where the reflow time is about 20 minutes and the reflow temperature is about 250° C., the solder makes an alloy so as to diffuses and well reaches Cr (or Ti) layer 13*b* to connect therewith as shown in the sectional structure of UBM end. The solder does not diffuse further so that there can be attained resistance against the solder attack. As the results, according to the analysis with EDX, Sn as the main component of the solder rapidly decreases around the position to show the peak of Cr, and completely diffuses and reaches Cr (or Ti) layer 13*b* but does not diffuse further so that there can be attained resistance and reliability on the connection. It is noted that Cu which is detected nearby is an inter-metallic compound with Sn.

Figure 6:
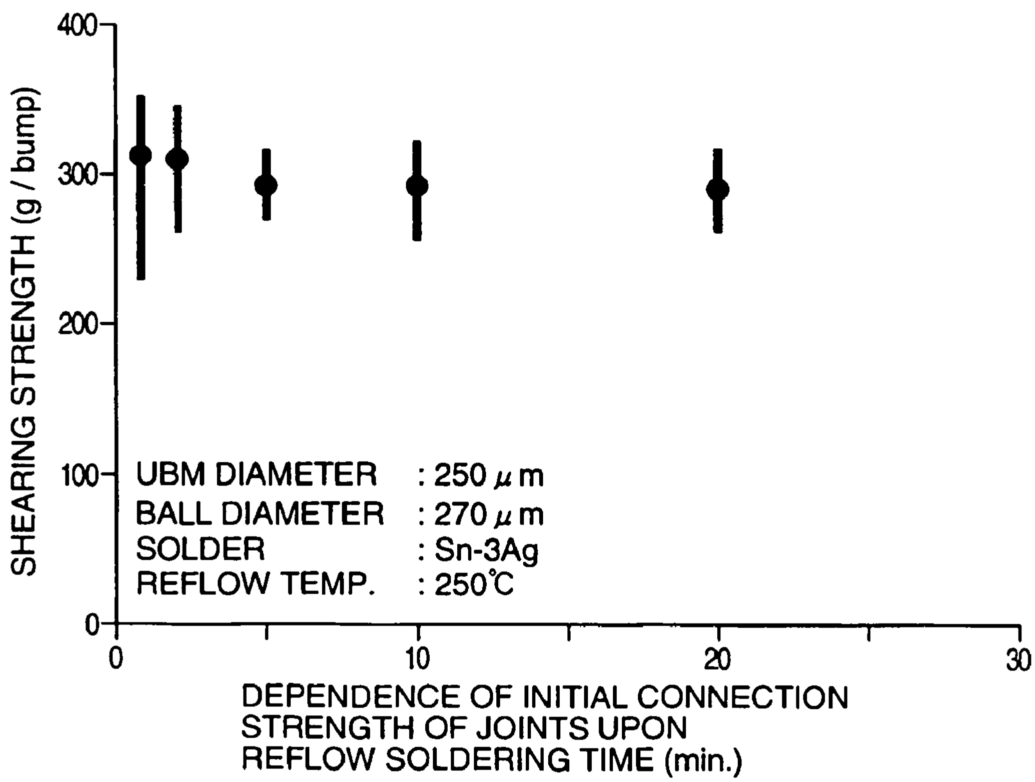
FIG. 6 shows a dependence of initial connection strength of joints upon the reflow soldering time with respect to the embodiment shown in FIG. 4.

FIG. 6 shows a dependence initial connection strength of joints upon the reflow soldering time. As can be seen from FIG. 6, in the case where the reflow time is about 1 to 2 minutes, the deviation of shearing strength from its center value of about 320 (g/bump) is larger. Thus, it can be understood that the solder makes alloy and does not sufficiently diffuse and reach Cr (or Ti) layer 13*b*. Further, if the reflow time becomes longer, the deviation of shearing strength from the center value of about 290 (g/bump) decreases which shows that the solder makes alloy to sufficiently diffuse and reach Cr (or Ti) layer 13*b* so that a complete connection between the solder and the Cr (or Ti) layer 13*b* can be attained.

Figure 7:
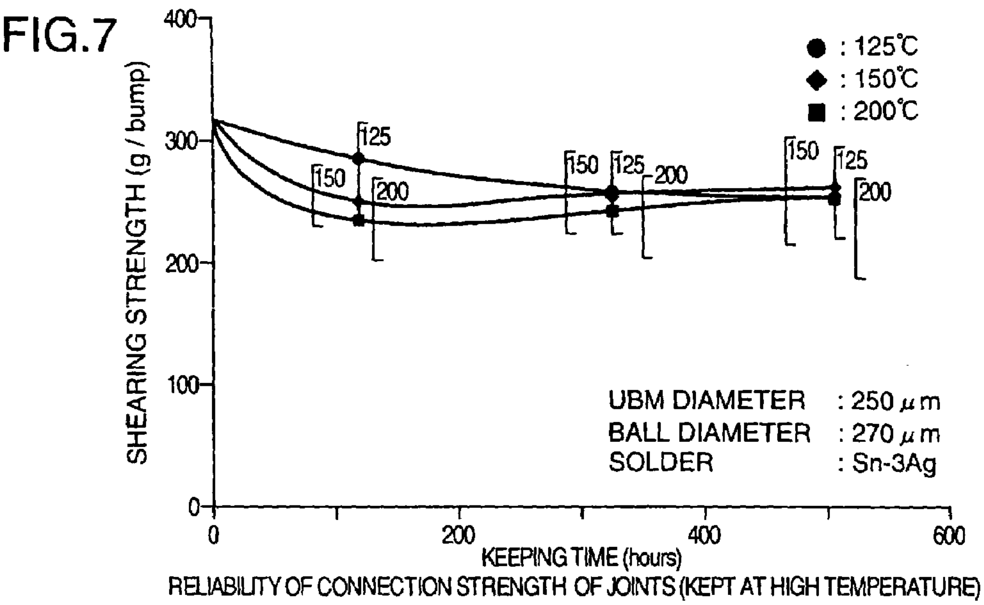
FIG. 7 shows a reliability of connection strength of joints kept at a high temperature with respect to the embodiment shown in FIG. 4.

FIG. 7 shows a reliability of connection strength of joints kept at a high temperature. It can be understood from FIG. 7, in respective cases of being kept at a high temperature of either 125° C., 150° C. or 200° C., although the initial shearing strength of about 320 (g/bump) decreases to about 240 to 250 (g/bump), the values are comparatively stable to not to lose but to be able to maintain the reliability on the connection strength.

Especially, it has been found that the reliability on connection is not stable unless the Sn—Ag system solder 17 diffuses through the Cu coating layer 13*a* and reaches the Cr (or Ti) layer 13*b* at the reflow soldering process. This will be because, even if the solder diffuses through the Cu coating layer 13*a* and reaches the Cr (or Ti) layer 13*b* during a long time service, actually the solder 17 can not reach the Cr (or Ti) layer 13*b* to be hindered by an extremely thin oxide layer at the interface between the Cr (or Ti) layer 13*b* and the Cu coating layer 13*a,* which is formed by oxygen which penetrates through the Cu coating layer 13*a* for a long time. Thus the Cu coating layer 13*a* must have a thickness of not less than about 0.1 μm in order to intercept oxygen in the reflow process and not more than about 10 μm to allow solder to diffuse through the Cu layer during soldering.

Taking the above into consideration, the invention has been proposed, in which the Cr or Ti layer 13*b* in the wiring is used for the purpose of ensuring good bonding and preventing solder diffusion and Cu is used as a coating layer 13*a* in order to prevent oxidization.

Since the invention structure is of the layered wiring comprising Cr/Cu/Cr or Ti/Cu/Cr, by exposing a part of the layered wiring, the part as exposed can be used as an electrode for soldering. However, it should be noted that the Sn containing solder must diffuse through the Cu layer 13*a* and reach the under layer of Cr or Ti 13*b* without failure during soldering as is described in the above.

Further, by forming an oxidization preventing layer such as an Au or Ni/Au layer or preflux on the exposed Cu layer 13*b,* wettability of solder can be improved.

In the above description, the solder 17 is directly connected to the wiring 13 which is connected to the electrode 12, but another wiring layer may be provided to connect the electrode 12 and the wiring 13. In this case, the wiring 13 will be formed as an electrode form. However, it means that an addition of another wiring layer causes an increase of processing steps.

Another embodiment will be described below referring to FIG. 8.

Figure 8:
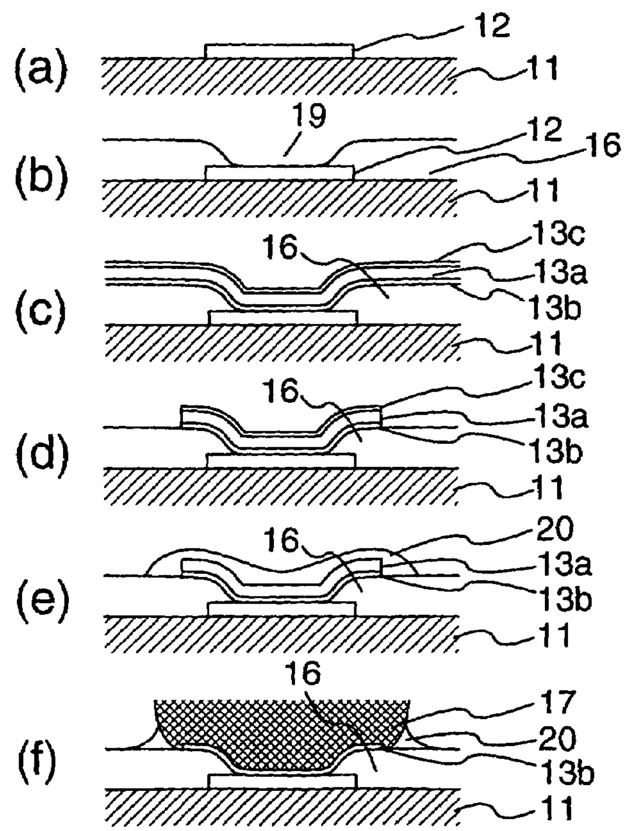
FIG. 8 shows sectional views of a wiring board and a semiconductor device according to a further embodiment of the invention.

As shown in FIG. 8, in the case where an electrode 12 is already formed at the position suitable for its connection on the board, since formation of the wiring 13 is not required, by forming an opening 19 in a protective film 16 to protect the board from an external force and the atmosphere right above electrode 12 and utilizing the opening 19 and its edge, Cr or Ti layer 13*b* of 0.1 μm thickness is formed to make a connection electrode which is a laminating metal layer according to the invention. Then, a Cu layer 13*a* of 0.5 to 3 μm thickness is formed on the Cr or Ti layer 13*b* and a Cr layer 13*c* of 0.05 to 0.1 μm thickness is formed on the top. Thereafter, a resist is formed on the above formed metal layers by the photo-lithography technology, subsequently unnecessary parts of the layers are progressively removed by etching with utilization of a solution of hydrochloric acid or a potassium ferricyanide system for the Cr layers 13*c* and 13*b* and of a solution of nitric acid or a ferric chloride system for the Cu layer 13*a* in the case where the solution of potassium ferricyanide system is used as an etching solution, it is possible to form the electrode by one time of a resist pattern forming work since no side etching occurs. In actual soldering, immediately after removing the top layer of Cr 13*a* by an etching solution and drying the electrode, by coating it with a flux 20, without using an expensive oxidization preventing film such Au, it is possible to avoid occurrence of defects due to lack of wettability of solder.

If soldering is conducted to the connection pad which is formed by the above process, in contrast to the embodiment described in the above, molten solder flows around side of the connection pad as shown in FIG. 8. Therefore, if a metal being inferior in resistance against molten solder is used, a side of the electrode is eroded or attacked with solder which may cause an area reduction of the connection pad and decrease of connection strength. However, in the case of the connection pad formed by the materials according to the invention, even if the Cu layer 13*a* which is not so superior in resistance against molten solder is almost lost, since the solder 17 connects with Cr or Ti layer 13*b* and the Cr or Ti layer 13*b* connects with the board, reduction of connection strength hardly occur. This is because Cr is very superior in resistance against molten solder.

Figure 9:
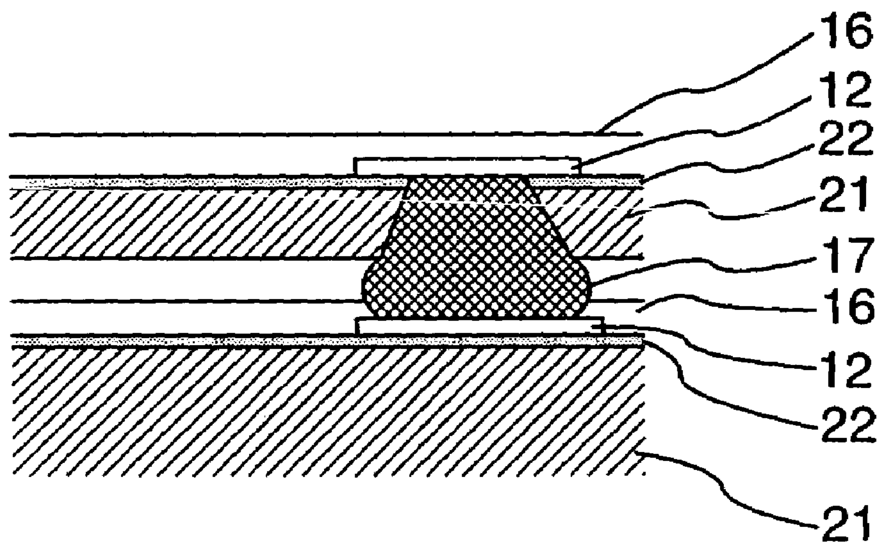
FIG. 9 shows a sectional view of a wiring board and a semiconductor device according to a still further embodiment of the invention.

A three dimensional package has been proposed as an effective means for the high density package and an example of producing its prototype has been also reported. In case of this package, after making a LSI chip very thin by polishing its back side surface, an opening is made in the Si for electric connection, through which a connection is made with another chip. Therefore, although several methods are tried as connection means, the most practical method is to use solder. In this method, after polishing the Si 21 to make it thinner, an opening is formed as shown in FIG. 9 and subsequently, for connecting with the connection electrode 12 provided on the side of the element/wiring layer 22, the solder 17 is connected to the back side of the electrode 12 different from the conventional case. However, since it is difficult to increase the film thickness of the electrode 12 in the producing method for LSIs, this case is not practical also from the point of manufacturing cost.

Figure 10:
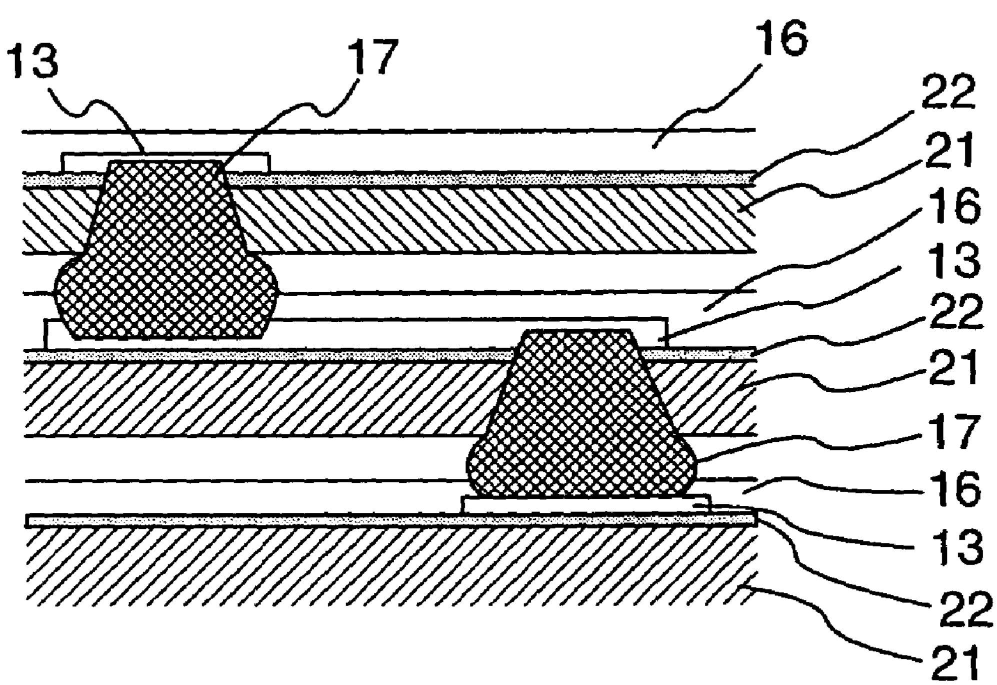
FIG. 10 shows a sectional view of a wiring board and a semiconductor device according to a further embodiment of the invention.

Thus, in the case where the electrode formed with the materials according to the invention for soldering connections is used, by the layered wiring 13 of a sandwich structure comprising two Cr or Ti layers 13*b* and Cu 13*a* therebetween as shown in the above embodiment of wiring, even in the case of soldering at the back side, with reference to the solder 17, the structure of soldering connection is the same as that in the above embodiment. Therefore, by the electrode and the structure according to the invention, a structure can be realized by a single layer, according to which soldering is possible from either side of the Si 21 or the element/wiring layer 22 as shown in FIG. 10.

By connecting the solder of the wiring board or semiconductor device according to the invention to the electrode, etc. of a board, an electronic apparatus or semiconductor device can be formed. Even if a further finer wiring and an advanced multi-layer are strongly desired in future according to the need for both higher performance and further multi-function of electronic apparatus or semiconductor device package structure, the function of connecting with outside can be maintained.

One advantage of the invention is that the wiring board or semiconductor device of high dependability of their connection and also high density taking account of electric properties can be manufactured.

Another advantage of the invention is that the wiring board or semiconductor device of high dependability on their connection and also high density provided taking account of electric properties can be manufactured in reduced process steps and at low cost.

Still another advantage of the invention is that the electronic apparatus and semiconductor device package structure provided with the wiring board and/or semiconductor device of high dependability on their connection and also high density taking account of electric properties can be manufactured at low cost.

What is claimed is:

1. A semiconductor device comprising:

a first wiring board;

a second wiring board; and an amount of solder disposed between the first wiring board and the second wiring board, wherein each of the wiring boards comprises:

a substrate;

an insulation layer disposed on the substrate; and a wiring comprising a first layer of Cr or Ti, a second layer of Cu, and a third layer of Cr or Ti, wherein the first layer is disposed adjacent the insulation layer and the second layer is disposed between the first layer and the third layer, wherein the solder is in contact with a portion of the wiring on the first wiring board such that the solder is diffused into its second layer and through it to form an electrical contact with its first layer, wherein the second wiring board includes an opening formed through its substrate and through its insulation layer, wherein the solder is disposed in the opening of the substrate and the insulation layer of the second wiring board, the solder contacting a portion of the wiring of the second wiring board such that the solder is diffused into its second layer and through it to form an electrical contact with its third layer.

2. The semiconductor device of claim 1 wherein in the wiring of the first wiring board, an opening is formed through its third layer at a location where the solder contacts its second layer.

3. The semiconductor device of claim 2 wherein in the wiring of the second wiring board, an opening is formed through its first layer at a location where the solder contacts its second layer.

4. The semiconductor device of claim 1 wherein the first wiring board further comprises a protective film disposed to envelope its wiring, the protective film having an opening through which the solder is disposed in order to contact the wiring of the first wiring board.

5. The package of claim 4 wherein the second wiring board further comprises a protective film disposed to envelope its wiring.

6. The package of claim 1, wherein the solder is a Sn-containing solder.

7. The package of claim 1, wherein the Cu layer has a thickness of from about 0.1 μm to about 10 μm.

8. The package of claim 1 further comprising:

a third wiring board; and a second amount of solder, wherein the third wiring board comprises:

a substrate;

an insulation layer disposed on the substrate; and a wiring comprising a first layer of Cr or Ti, a second layer of Cu, and a third layer of Cr or Ti, wherein the first layer is disposed adjacent the insulation layer and the second layer is disposed between the first layer and the third layer, wherein the solder is in contact with a second portion of the wiring of the second wiring board such that the solder is diffused into its second layer and through it to form an electrical contact with its first layer, wherein the third wiring board includes an opening formed through its substrate and through its insulation layer, wherein the solder is disposed in the opening of the substrate and the insulation layer of the third wiring board, the solder contacting a portion of the wiring of the third wiring board such that the solder is diffused into its second layer and through it to form an electrical contact with its third layer.

9. The semiconductor device of claim 8 wherein in the wiring of the second wiring board, an opening is formed through its third layer at a location of its second portion.

10. The semiconductor device of claim 9 wherein in the wiring of the third wiring board, an opening is formed through its first layer at a location where the solder contacts its second layer.

* * * * *

UNITED STATES PATENT AND TRADEMARK OFFICE

CERTIFICATE OF CORRECTION

PATENT NO. : 6,998,713 B2
APPLICATION NO. : 10/833790
DATED : February 14, 2006
INVENTOR(S) : Yasunori Narizuka et al.

It is certified that error appears in the above-identified patent and that said Letters Patent is hereby corrected as shown below:

On the Title page, Item (73), the name of the Assignee “Hitachi Ltd.” should be --Renesas Technology Corporation--.

Signed and Sealed this

Nineteenth Day of February, 2008

JON W. DUDAS
*Director of the United States Patent and Trademark Office*